United States Patent [19]

Arikawa et al.

[11] Patent Number: 5,298,459
[45] Date of Patent: Mar. 29, 1994

[54] METHOD OF MANUFACTURING SEMICONDUCTOR DEVICE TERMINAL HAVING A GOLD BUMP ELECTRODE

[75] Inventors: Shinichiro Arikawa; Hiroaki Murakami, both of Suwa, Japan

[73] Assignee: Seiko Epson Corporation, Tokyo, Japan

[21] Appl. No.: 665,234

[22] Filed: Mar. 5, 1991

Related U.S. Application Data

[62] Division of Ser. No. 439,090, Nov. 20, 1989, abandoned.

[30] Foreign Application Priority Data

Nov. 21, 1988 [JP] Japan ................... 63-294000
Apr. 13, 1989 [JP] Japan ....................... 1-94120
May 19, 1989 [JP] Japan ..................... 1-125825

[51] Int. Cl.⁵ ............................. H01L 21/441
[52] U.S. Cl. ................................ 437/183; 437/192; 148/DIG. 131
[58] Field of Search ............. 437/183, 192, 194, 201; 148/DIG. 131; 204/192.34

[56] References Cited

U.S. PATENT DOCUMENTS

| | | | |
|---|---|---|---|
| 4,787,958 | 11/1988 | Lytle | 437/183 |
| 4,880,708 | 11/1989 | Sharma et al. | 437/194 |
| 5,108,950 | 4/1992 | Wakabayashi et al. | 437/183 |

FOREIGN PATENT DOCUMENTS

| | | | |
|---|---|---|---|
| 0159727 | 7/1986 | Japan | 437/183 |
| 0090156 | 4/1988 | Japan | 437/183 |

Primary Examiner—Brian E. Hearn
Assistant Examiner—C. Chaudhari
Attorney, Agent, or Firm—Spensley Horn Jubas & Lubitz

[57] ABSTRACT

A semiconductor device provided with an external connection terminal composed of a metal bump electrode. A first metal film is formed on the entire surface of the semiconductor device, a second metal film on the first metal film, and a third metal film on the second metal film. A resist film is selectively formed on the third metal film. A metal bump electrode is formed on the third metal film, at a portion at which the resist film is not present by electrolytic plating while using the third metal film as a conductive plating electrode and the resist film as a mask. The resist film is removed and the metal films are etched while using the metal bump electrode as a mask.

3 Claims, 6 Drawing Sheets

METHOD OF MANUFACTURING SEMICONDUCTOR DEVICE TERMINAL HAVING A GOLD BUMP ELECTRODE

This is a division of application Ser. No. 07/439,090 filed on Nov. 20, 1989, now abandoned.

BACKGROUND OF THE INVENTION

1. Field of the Invention

The invention relates to a method of manufacturing a semiconductor device and, more particularly, to a semiconductor device having a gold bump for an electrode constituting an external connecting terminal

2. Description of the Prior Art

Many proposals have conventionally been made for methods of manufacturing a gold bump for an electrode of a semiconductor device. FIGS. 6 are a cross-sectional view showing the steps of a conventional manufacturing process for a gold bump for an electrode.

Conventionally, as shown in FIG. 6a, an Al electrode pad 62 and a passivation film 63 are formed on an integrated circuit 61. Then, as shown in FIG. 6b, a Ti film layer 64 having a thickness of 0.1 $\mu$m and a pt film layer 65 having a thickness of 0.2 $\mu$m is formed over the entire surface of integrated circuit 61 by sputtering or deposition. Thereafter, as shown in FIG. 6c, a photoresist film layer 66 is formed above pad 62 to a thickness of 1 $\mu$m by using a positive or negative resist. The unnecessary portion of the Pt film layer 65 is next removed by wet etching using aqua regia (a mixed solution of hydrochloric acid and nitric acid) and using layer 66 as a mask. After removing the photoresist film layer 66 by a remover or an oxygen-plasma method, a photoresist film layer 67 is formed to a thickness of 3 $\mu$m by using a positive or negative resist in such a manner as to have an opening portion on the patterned Pt film layer 65, as shown in FIG. 6e. A bump electrode 68 is formed by Au electrolytic plating while using the photoresist film layer 67 as a mask, and using the Ti film layer 64 as a conductive film for electrolytic plating. The photoresist film 67 is then removed by a remover or an oxygen-plasma method, leaving the structure shown in FIG. 6f. Finally, the unnecessary portion of the Ti film layer 64 is removed by using a mixed solution of ammonia water and aqueous hydrogen peroxide while using the patterned Pt film layer 65 as a mask, resulting in the structure shown in FIG. 6g.

This conventional manufacturing method has the following drawbacks.

Firstly, since photoresist film layer 66 is used as an etching mask for Pt film layer 65, two photo processes, including a photo process for Au plating, are required.

Secondly, since bump electrode 68 formed by Au plating must be adhered to Pt film layer 65, which metal is different from Au, the strength of the adhesive bond is so low that its reliability is insufficient when bump electrode 68 is mounted on a semiconductor device. Ti thin film 64 is used as the conductive film for Au plating. Since a Ti surface is readily oxidized, a contact failure is apt to be caused at the contact point, and since the Ti film is thin, the conductive film is sometimes broken at the stepped portion on the surface of the integrated circuit.

In addition, since there is no step of etching the surface of the bump electrode 68, when the bump electrode 68 is mounted on a semiconductor device, a large electric resistance is caused between the bump electrode and the substrate by the adhesion of a residue of the photoresist film 67 or the like.

SUMMARY OF THE INVENTION

Accordingly, it is an object of the present invention to alleviate the above-described problems in the prior art and to provide a method of manufacturing a semiconductor device provided with a gold bump electrode having a high adhesive strength and a low electric resistance by a simple and economical process.

The above and other objects are achieved, according to the invention, by a method of manufacturing an external connection terminal composed of a metal bump electrode on a semiconductor device, the method comprising the steps of:

forming a first metal film on the entire surface of the semiconductor device;

forming a second metal film on the first metal film;

forming a third metal on the second metal film;

selectively forming, on the third metal film, a resist film having an opening via which a portion of the third film is exposed;

forming a metal bump electrode on the exposed portion of the third metal film by electrolytic plating while using the third metal film as a conductive plating electrode and the resist film as a mask;

removing the resist film; and etching the third metal film, the second metal film and the third metal film by ion beam etching while using the metal bump electrode as a mask.

The method according to the invention, described in greater detail, may include:

a first step of forming a first metal film as an adhesive layer, a second metal film as an interdiffusion preventive barrier and a third metal film as a primary coat electrode for electrolytic plating in that order on the entire surface of an integrated circuit;

a second step of forming a resist film, particularly a photoresist film, having a predetermined opening portion on the third metal film;

a third step of forming a bump electrode by electrolytic plating using the photoresist film as a mask, followed by removing the photoresist film; and a fourth step of removing the first metal film, the second metal film and the third metal film by one of the following steps (a) to (d):

(a) removing the third metal film, the second metal film and the first metal film by ion beam etching while using the bump electrode as a mask in a self-alignment manner, or (b) removing the third metal film by wet etching, and the second metal film and the first metal film by ion beam etching while using the bump electrode as a mask in a self-alignment manner, or (c) removing the third metal film and the second metal film by ion beam etching and the first metal film by wet etching while using the bump electrode as a mask in a self-alignment manner, or (d) removing the third metal film by wet etching, the second metal film by ion beam etching and the first metal film by wet etching while using the bump electrode as a mask in a self-alignment manner;

wherein the first metal film is a Ti film, the second metal film is a Pt film, the third metal film is an Au film, and the bump electrode formed by electrolytic plating is an Au electrode.

The above and other objects, features and advantages of the present invention will become clear from the following description of preferred embodiments thereof, taken in conjunction with the accompanying drawings.

DESCRIPTION OF THE PREFERRED EMBODIMENTS

Figure 1A:
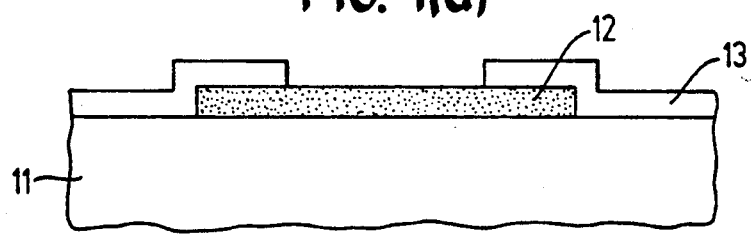
FIGS. 1(a) to 1(d), FIG. 2(a), FIGS. 3(a) and 3(b), FIGS. 4(a) and 4(b) and FIGS. 5(a) to 5(c) are sectional views of respective steps of embodiments of the method of manufacturing a semiconductor device according to the present invention.

Referring to FIG. 1a, an integrated circuit 11 in which impurity diffusion, wiring and insulation film forming steps have been performed and completed is provided with an aluminum electrode pad 12 formed to a thickness of 1.0 $\mu$m by sputtering and a passivation film 13 of $Si_3N_4$ is formed to a thickness of 1.5 $\mu$m by plasma CVD Metal films layers are then formed on aluminum electrode pad 12 in the following manner. Prior to the formation of the metal film layers, the oxide film ($Al_2O$) naturally present on the surface of aluminum electrode pad 12 is removed by reverse sputtering carried out in the same vacuum. By removing 100 Å of the natural oxide film calculated in terms of $SiO_2$ film by reverse sputtering, a very low electric resistance is realized.

Figure 1B:
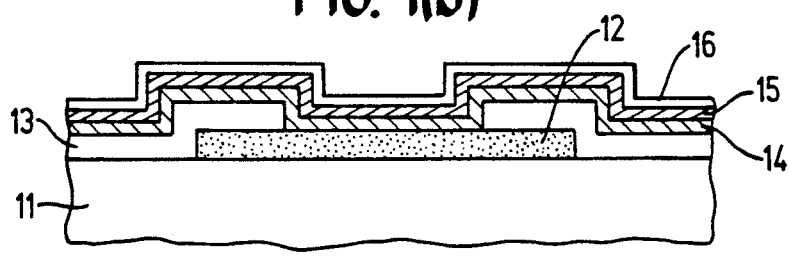

Thereafter, as shown in FIG. 1b, a Ti film layer 14 0.1 $\mu$m thick, serving as an adhesive layer, a Pt film layer 15 0.2 $\mu$m thick serving as an interdiffusion preventive barrier layer and an Au film layer 16 0.1 $\mu$m thick serving as a primary coat for plating are formed in series by sputtering carried out in the same vacuum.

Figure 1C:
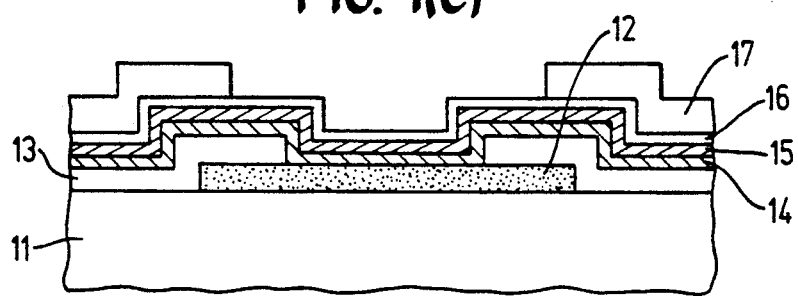

A photoresist film mask 17 is next formed on the Au film layer 16 such that the portion to be plated is open, as shown in FIG. 1(c). To form film 17, a positive type photoresist is applied to Au film layer 16 to a thickness of 3 $\mu$m by spin coating and prebaked at 90° C. in $N_2$. Ultraviolet rays are projected solely to the portion to be plated while using a photomask. For development, an organic alkali solvent is used. Thereafter, the photoresist is postbaked, thereby completing the formation of the photoresist film 17.

Figure 1D:
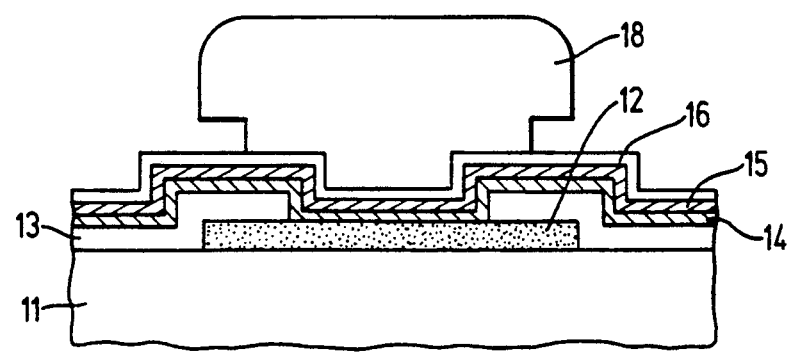

An Au bump 18 is then formed at the opening in photoresist film 17 by electrolytic plating while using photoresist film 17 as a mask, as shown in FIG. 1(d). As the plating bath, a gold potassium sulfite maintained at 30° C. and appropriately stirred is used. When electrolytic plating is carried out at a current density of 1 A/dm² for 30 minutes, the Au bump 18 grows to a height of about 25 $\mu$m and takes on the form of a mushroom. When the photoresist film 17 is dissolved and removed by a remover containing diethylene glycol monobutyl ether and monoethanol amine as a base, a structure including the Au bump 18 shown in FIG. 1(d) is obtained.

Figure 2A:
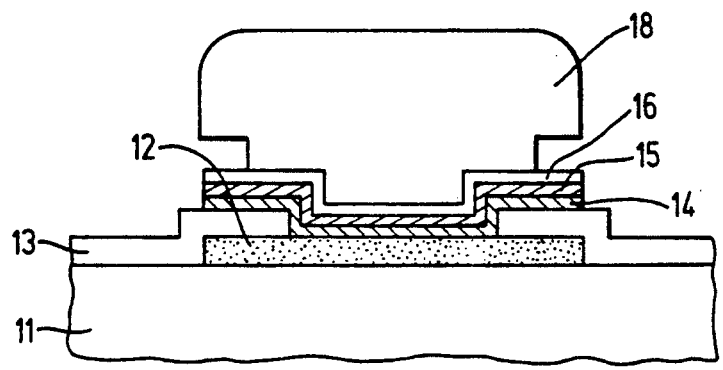

Au film layer 16, Pt film layer 15 and Ti film layer 14 are next etched by one of the following methods (1) to (4):

(1) As shown in FIG. 2(a), Au film layer 16, Pt film layer 15 and Ti film layer 14 are selectively removed by ion beam etching while using Au bump 18 as a masking material. Etching is carried out at an ion beam current of 600 mA and a voltage of 800 V under an argon pressure of $2\times10^{-4}$ Torr for about 20 minutes. Since Au film layer 16, Pt film layer 15 and the Ti film layer 14 are etched in sequence at one step, the process can be composed of very simple steps. In addition, since the surface of the Au bump 18 is simultaneously etched by about 2 $\mu$m, contamination of the photoresist or the like is completely removed, so that the adhesive strength in mounting the electrode on a semiconductor device is very strong and a bump electrode having a low electric resistance is obtained.

Figure 3A:
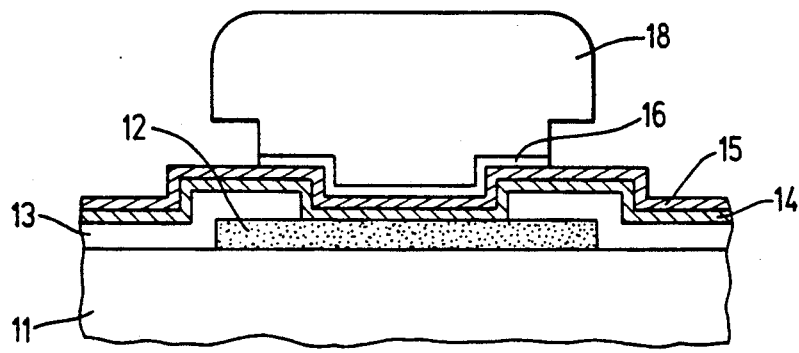
Figure 3B:
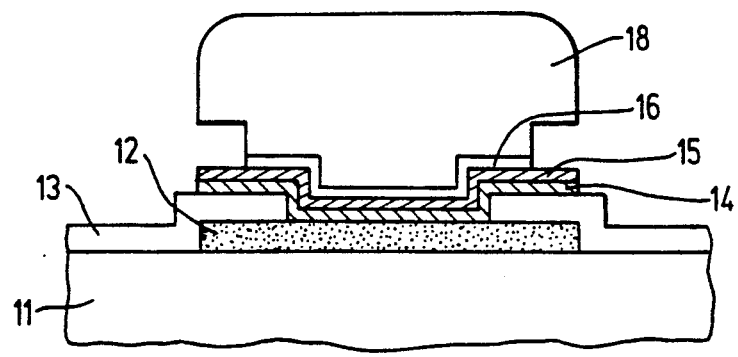

(2) As shown in FIG. 3(a), Au film layer 16 is removed by wet etching while using Au bump 18 as a masking material. As the etchant, 20g/1 of a potassium cyanide solution is used and immersion of the Au film layer 16 at ordinary temperature (25° C.) for 60 seconds can completely remove the Au film layer 16. Simultaneously with removal of Au film layer 16 by etching, the surface of Au bump 18 is etched by about 0.1 $\mu$m. Pt film layer 15 and Ti film layer 14 are then removed by ion beam etching while using Au bump 18 as a mask, as shown in FIG. 3(b). Etching is carried out with an ion beam current of 600 mA and a voltage of 800 V under an argon pressure of $2\times10^{-4}$ Torr for about 17 in minutes. Since Pt film layer 15 and Ti film layer 14 are etched in sequence in one step, the process can be composed of very simple steps. In addition, since the surface of Au bump 18 is simultaneously etched by about 2 $\mu$m by both wet etching and dry etching, contamination of the photoresist or the like is completely removed, so that the adhesive strength in mounting the electrode on a semiconductor device is very strong and a bump electrode having a low electric resistance is obtained.

Figure 4A:
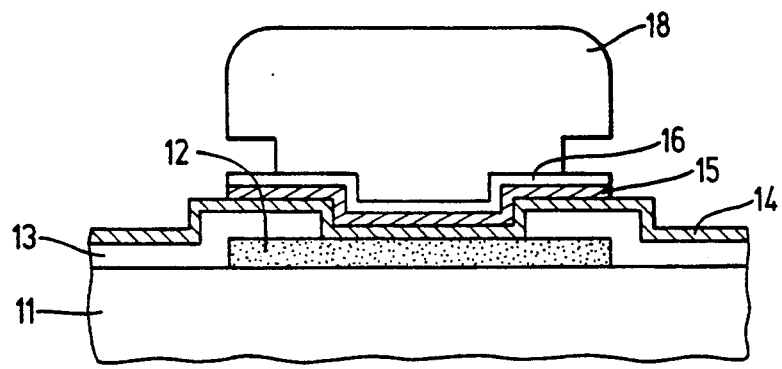
Figure 4B:
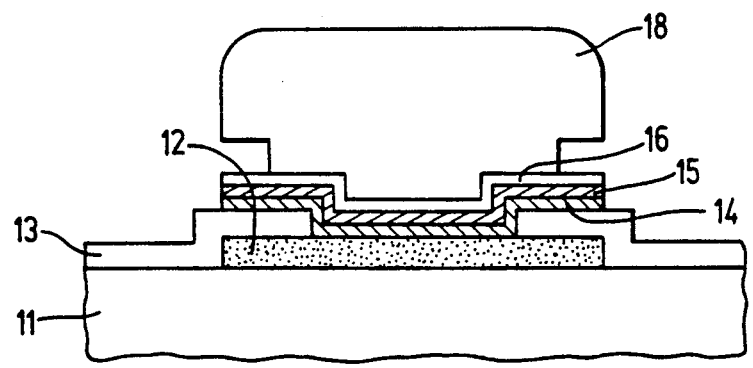

(3) As shown in FIG. 4(a), Au film layer 16 and Pt film layer 15 are removed by ion beam etching while using Au bump 18 as a mask. Etching is carried out with an ion beam current of 600 mA and a voltage of 800 V under an argon pressure of $2\times10^{-4}$ Torr for about 7 minutes. Ti film layer 14 is then removed by wet etching, as shown in FIG. 4(b). Etching is carried out by using a mixture of 30% ammonia water, aqueous 30% hydrogen peroxide and pure water in the ratio of 1:1:1 as the etchant and at ordinary temperature (25° C.) for about 60 seconds. Since Au film layer 16 and the pt film layer 15 are etched in sequence in one step, the process can be composed of very simple steps. In addition, since the etching of Ti, which takes a long time, is carried out by wet etching, productivity is high. Since the surface of Au bump 18 is simultaneously etched by about 0.4 $\mu$m, contamination of the photoresist or the like is completely removed, so that the adhesive strength in mounting the electrode on a semiconductor device is very strong and a bump electrode having a low electric resistance is obtained.

Figure 5A:
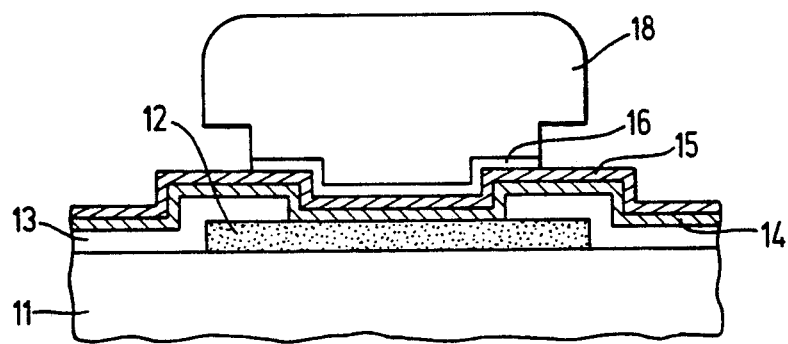
Figure 5B:
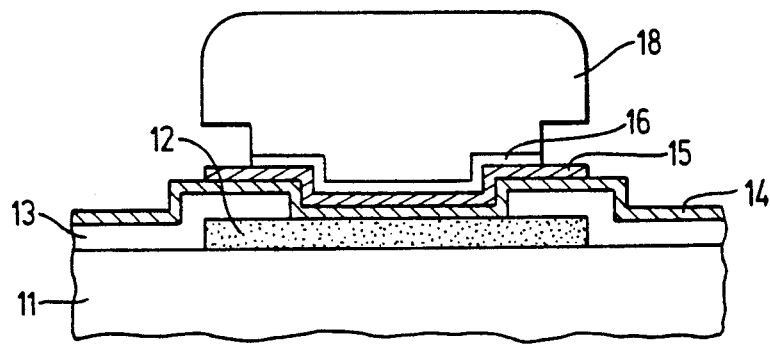
Figure 5C:
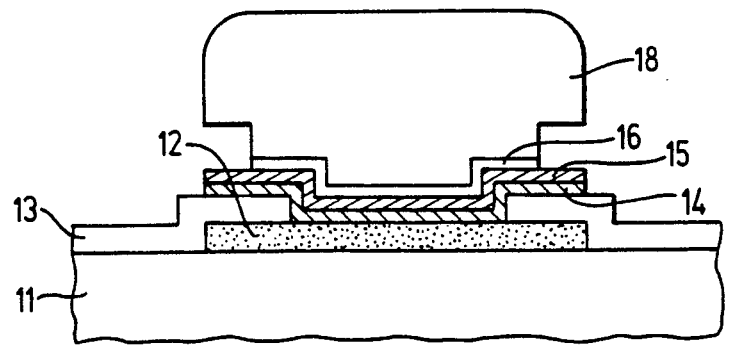
Figure 6A:
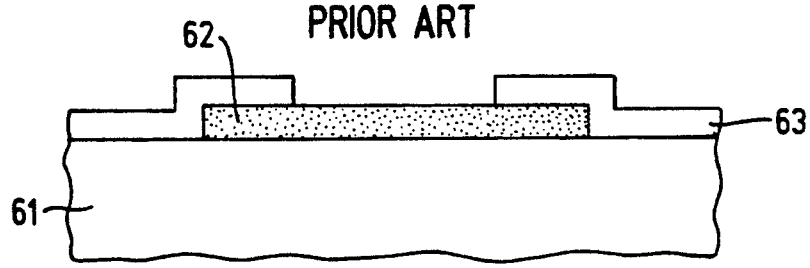
FIGS. 6(a) to 6(g) are sectional views of respective steps of a conventional method of manufacturing a semiconductor device, which has already been described.
Figure 6B:
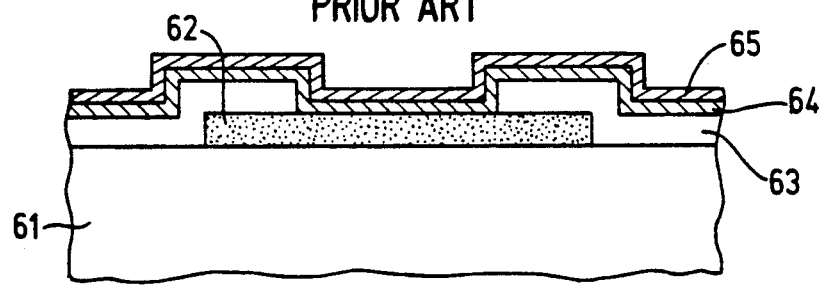
Figure 6C:
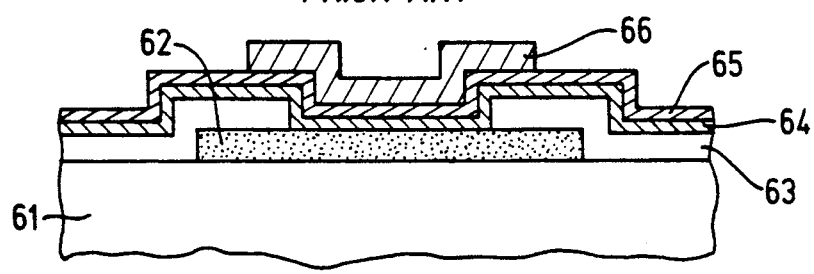
Figure 6D:
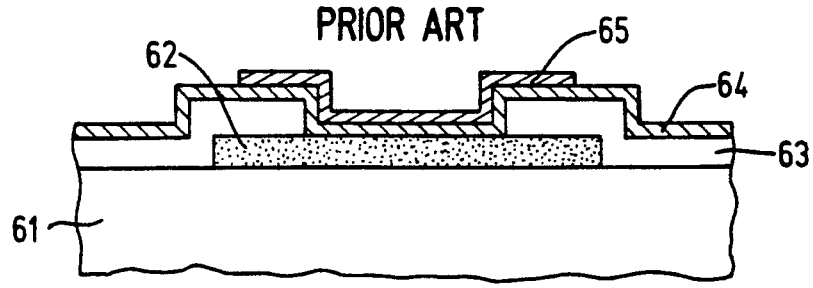
Figure 6E:
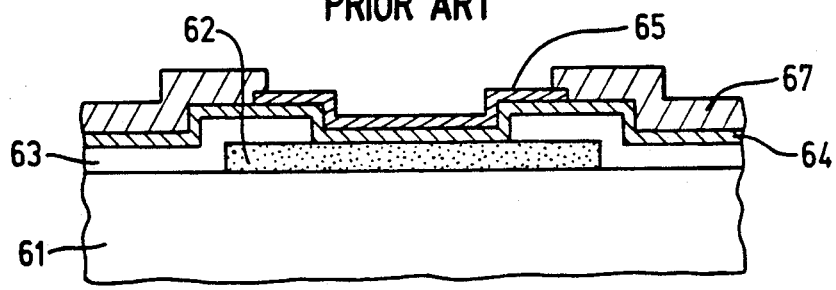
Figure 6F:
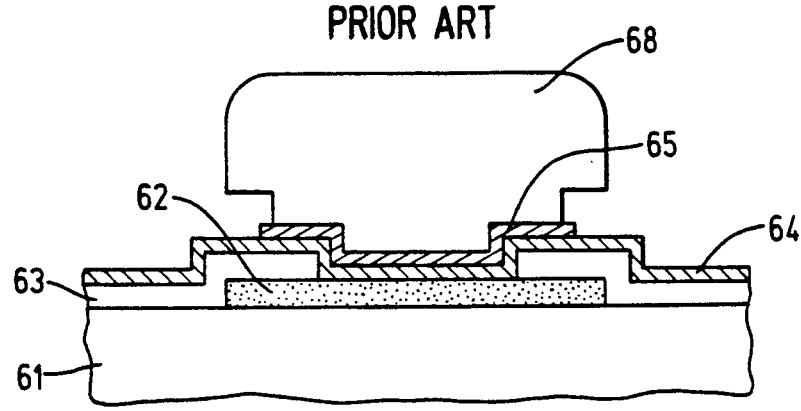
Figure 6G:
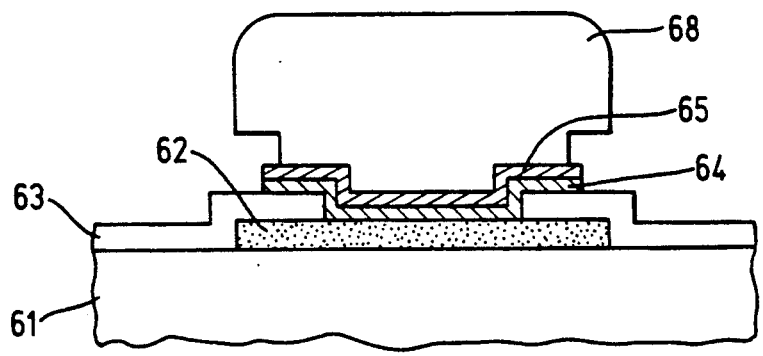

(4) in FIG. 5(a), Au film layer 16 is removed by wet etching while using Au bump 18 as a masking material. As the etchant, 20g/1 of a potassium cyanide solution is used and immersion of Au film 16 at ordinary temperature (25° C.) for 60 seconds can completely remove Au film layer 16. Simultaneously with the removal of Au film layer 16 by etching, the surface of Au bump 18 is etched by about 0.1 $\mu$m. Pt film layer 15 is then removed by ion beam etching while using Au bump 18 as a mask, as shown in FIG. 5(b). Etching is carried out with an ion beam current of 600 mA and a voltage of 800 V under an argon pressure of $2\times10^{-4}$ Torr for about 5 minutes. During this time, the surface of Au bump 18 is also etched by another 0.5 $\mu$m. Ti film layer 14 is finally removed by wet etching, as shown in FIG. 5(c). This etching is carried out by using a mixture of 30% ammonia water, aqueous 30% hydrogen peroxide and pure water in the ratio of 1:1:1 as the etchant and at ordinary temperature (25° C.) for about 60 seconds. Since ion beam etching, which takes a long time, is used only for Pt, and Au and Ti are removed by wet etching, productivity is very high. In addition, since the surface of Au bump 18 is simultaneously etched by about 0.6 μm by both wet etching and dry etching, contamination of the photoresist or the like is completely removed, so that the adhesive strength in mounting the electrode on a semiconductor device is very strong and a bump electrode having a low electric resistance is obtained.

In this way, the gold bump electrode is formed on the integrated circuit. The gold bump electrode formed has a high adhesive strength and a low electric resistance, as described above. Since the one sputtering step, the one photo step and the etching step are all carried out without using any mask, the manufacturing process is simple and has a high productivity.

Since Ti is used as the adhesive layer, not only is the adhesion with the Al electrode pad and the passivation film on the integrated circuit ensured, but also the corrosion resistance of Ti allows the semiconductor device to be used in an environment having a high voltage and high temperature and humidity with high reliability. Since Pt is used as the diffusion preventive barrier, interdiffusion between the Al electrode pad and the Au bump is prevented. Pt itself also has a high corrosion resistance. In addition, since the Au film layer is provided between the Au bump formed by plating and the Pt film formed as the diffusion preventive barrier, the plating adhesive is greatly enhanced, thereby greatly enhancing the mechanical strength and the reliability of the bump electrode itself.

As explained above, the manufacturing method of the present invention not only produces a gold bump electrode which itself has a high mechanical strength, a low electric resistance and a high reliability, but also provides the gold bump with a high adhesive strength at the time of mounting and a low electric resistance on the mounted surface. Thus, it is possible to provide an integrated circuit having a high corrosion resistance and a high reliability. It is also possible to provide a semiconductor device with bump electrodes by a simple and highly productive process.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A method of manufacturing an external connection terminal composed of a metal bump electrode on a semiconductor device, said method comprising the steps of:
   forming a first film of Ti metal on the entire surface of said semiconductor device;
   forming a second file of Pt metal on said first metal film;
   forming a third film of Au metal on said second metal film;
   selectively forming, on said third metal film, a resist film having an opening via which a portion of said third metal film is exposed;
   forming a bump electrode of Au metal on said exposed portion of said third metal film by electrolytic plating while using said third metal film as a conductive plating electrode and said resist film as a mask;
   removing said resist film; and
   etching said third metal film by wet etching and said second metal film by ion beam etching and said first metal film by ion beam etching while using said metal bump electrode as a mask.

2. A method of manufacturing an external connection terminal composed of a metal bump electrode on a semiconductor device, said method comprising the steps of:
   forming a first film of Ti metal on the entire surface of said semiconductor device;
   forming a second film of Pt metal on said first metal film;
   forming a third film of Au metal on said second metal film;
   selectively forming, on said third metal film, a resist film having an opening via which a portion of said third metal film is exposed;
   forming a bump electrode of Au metal on said exposed portion of said third metal film by electrolytic plating while using said third metal film as a conductive plating electrode and said resist film as a mask;
   removing said resist film; and
   etching said third metal film and said second metal film by ion beam etching and said first metal film by wet etching while using said metal bump electrode as a mask.

3. A method of manufacturing an external connection terminal composed of a metal bump electrode on a semiconductor device, said method comprising the steps of:
   forming a first film of Ti metal on the entire surface of said semiconductor device;
   forming a second film of Pt metal on said first metal film;
   forming a third film of Au metal on said second metal film;
   selectively forming, on said third metal film; a resist film having an opening via which a portion of said third metal film is exposed;
   forming a bump electrode of Au metal on said exposed portion of said third metal film by electrolytic plating while using said third metal film as a conductive plating electrode and said resist film as a mask;
   removing said resist film; and
   etching said third metal film by wet etching, said second metal film by ion beam etching and said first metal film by wet etching while using said metal bump electrode as a mask.

* * * * *